United States Patent
Baek et al.

(10) Patent No.: US 10,003,323 B2
(45) Date of Patent: Jun. 19, 2018

(54) IMPEDANCE CALIBRATION CIRCUIT

(71) Applicant: SK hynix Inc., Icheon-si, Gyeonggi-do (KR)

(72) Inventors: Seung Geun Baek, Seoul (KR); Jae Il Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days. days.

(21) Appl. No.: 15/697,076

(22) Filed: Sep. 6, 2017

(65) Prior Publication Data

US 2017/0366169 A1    Dec. 21, 2017

Related U.S. Application Data

(62) Division of application No. 15/409,057, filed on Jan. 18, 2017, now Pat. No. 9,787,287, which is a division of application No. 14/875,788, filed on Oct. 6, 2015, now abandoned.

(30) Foreign Application Priority Data

Jun. 12, 2015    (KR) .................. 10-2015-0083635

(51) Int. Cl.
*H03K 17/16* (2006.01)
*H03K 19/003* (2006.01)
*H03H 11/28* (2006.01)

(52) U.S. Cl.
CPC .................... *H03H 11/28* (2013.01)

(58) Field of Classification Search
CPC .................. H03K 19/0005; H03H 11/28
USPC ................................................ 326/30
See application file for complete search history.

(56) References Cited

U.S. PATENT DOCUMENTS

| | | |
|---|---|---|
| 8,508,251 B2 | 8/2013 | Choi et al. |
| 9,515,659 B2 * | 12/2016 | Williams ......... H03K 19/01759 |
| 2008/0211548 A1 | 9/2008 | Hayashi et al. |
| 2010/0327903 A1 | 12/2010 | Park |
| 2011/0291698 A1 | 12/2011 | Ko |
| 2014/0325135 A1 * | 10/2014 | Anderson .......... H03K 19/0005 |
| | | 711/105 |

* cited by examiner

*Primary Examiner* — Daniel D Chang
(74) *Attorney, Agent, or Firm* — William Park & Associates Ltd.

(57) ABSTRACT

An impedance calibration circuit is disclosed, which relates to a technology for improving precision of pad resistance. The impedance calibration circuit includes: a first On Die Termination (ODT) circuit selected by a first selection signal, configured to tune its own resistance using a first code signal, and output a first resistance value to an output terminal; and a second ODT circuit selected by a second selection signal, configured to tune its own resistance using a second code signal, and output a second resistance value to the output terminal.

7 Claims, 4 Drawing Sheets

IMPEDANCE CALIBRATION CIRCUIT

CROSS-REFERENCE TO RELATED APPLICATION

The present application is a divisional application of U.S. application Ser. No. 14/875,788, filed on Oct. 6, 2015, and claims priority based upon Korean patent application No. 10-2015-0083635, filed on Jun. 12, 2015, the disclosure of which is hereby incorporated in its entirety by reference herein.

BACKGROUND

Embodiments of the present disclosure relate to an impedance calibration circuit, and more particularly to a technology for improving precision of pad resistance.

A termination resistor having the same resistance as characteristic impedance of a transmission (Tx) channel is coupled to a receiver or a transmitter of a semiconductor device. The termination resistor matches impedance of the receiver or the transmitter to characteristic impedance of the transmission (Tx channel, such that it can suppress reflection of signals transmitted through the Tx channel. Although termination resistors according to the related art have been installed outside the semiconductor device, the latest termination resistors have been implemented as On Die Termination (ODT) circuits in which termination resistors are installed inside the semiconductor device.

Each ODT circuit includes a switching circuit that is turned on or off to control a current flowing in the semiconductor device, such that power consumption of the ODT circuit is less than that of an external termination resistor installed outside. Since a resistance value of the ODT circuit is changed according to PVT (Process, Voltage, Temperature) conditions, the resistance value of the ODT circuit is calibrated using an impedance calibration (ZQ calibration) circuit, prior to using the ODT circuit.

The impedance calibration (ZQ calibration) circuit includes a comparator configured to compare a resistance value of an external resistor connected to a pad with a reference voltage, such that a pull-up code and a pull-down code for calibrating the resistance value of the ODT circuit are generated. In this case, the external resistor connected to the pad may have a constant resistance value (generally, 240Ω) irrespective of the PVT condition change.

SUMMARY

In accordance with an embodiment of the present disclosure, an impedance calibration circuit includes a first On Die Termination (ODT) circuit selected by a first selection signal, configured to tune its own resistance using a first code signal, and output a first resistance value to an output terminal. The impedance calibration circuit also includes a second ODT circuit selected by a second selection signal, configured to tune its own resistance using a second code signal, and output a second resistance value to the output terminal.

In accordance with an embodiment of the present disclosure, an impedance calibration circuit includes a first code generation circuit selected by a first selection signal, configured to tune its own resistance using a first code signal to output a first resistance value to an output terminal, and to compare a voltage of the output terminal with a first reference voltage to control the first code signal. The impedance calibration circuit also includes a second code generation circuit selected by a second selection signal, configured to tune its own resistance using a second code signal to output a second resistance value to the output terminal, and to compare the voltage of the output terminal with a second reference voltage to control the second code signal.

In accordance with an embodiment of the present disclosure, an impedance calibration circuit includes a plurality of On Die Termination (ODT) circuits tuned by a code signal, configured to output different resistance values to an output terminal. The impedance calibration circuit also includes a selection unit configured to select any one of a plurality resistance values using a selection signal. The impedance calibration circuit also includes a reference voltage selection unit configured to select any one of a plurality of reference voltages using the selection signal. The impedance calibration circuit also includes a fixed resistor having a fixed resistance value. The impedance calibration circuit also includes a comparator configured to compare a voltage generated by a ratio of the fixed resistance value of the fixed resistor to a resistance value of the output terminal with an output voltage of the reference voltage selection unit, and output the code signal according to a result of the comparison.

The first resistance value, the second resistance value and the third resistance value each have different values.

The first code signal, the second code signal, and the third code signal are generated by impedance calibration.

The impedance calibration indicates that the first code signal, the second code signal and the third code signal change in relation to pressure, voltage and temperature conditions.

The first code signal, the second code signal, and the third code signal are used to perform impedance matching.

The first ODT circuit is configured to change the first resistance value outputted to the output terminal.

The impedance calibration circuit further comprising: a first comparator, a second comparator, and a third comparator configured to each have different reference values to tune different code signals.

The first resistance value, the second resistance value and the third resistance value have different values from each other that each depend on first, second or third fixed resistances.

The first code signal, second code signal and third code signal each depend on a ratio of an output resistance of a first, second or third On Die Termination (ODT) circuit to a first, second or third fixed resistance.

A final resistance value of the output terminal is obtained by dividing an output resistance of one of a first, second or third On Die Termination (ODT) circuit with a first, second or third fixed resistance.

The first, second and third code signal are each generated based on a different value of a power-supply voltage.

The comparator is configured to compare a voltage value of the output terminal with the output voltage of the reference voltage selection unit to generate the code signal.

The voltage value of the output terminal is generated by a ratio of an output resistance of the selection unit to the fixed resistance value.

The selection unit is configured to output the one of the plurality of resistance values of a first, second or third On Die Termination (ODT) circuit to the output terminal.

The reference voltage selection unit is configured to output a first reference voltage, a second reference voltage, or a third reference voltage to the comparator.

The reference voltage selection unit outputs the first reference voltage, the second reference voltage, or the third reference voltage to the comparator based on a signal selected by a selection signal.

DETAILED DESCRIPTION

Reference will now be made in detail to embodiments of the present disclosure, examples of which are illustrated in the accompanying figures. Wherever possible, the same reference numbers are used throughout the figures to refer to the same or like portions. In the following description of the present disclosure, a detailed description of related known configurations or functions incorporated herein may be omitted for clarity of the subject matter of the present disclosure. Various embodiments of the present disclosure are directed to providing an impedance calibration circuit that substantially obviates one or more problems due to limitations and disadvantages of the related art. The embodiments of the present disclosure relate to a technology for reducing the overlap parasitic capacitance value by acquiring multiple-tuned resistance during the ZQ calibration, resulting in increased precision of pad resistance.

Figure 1:
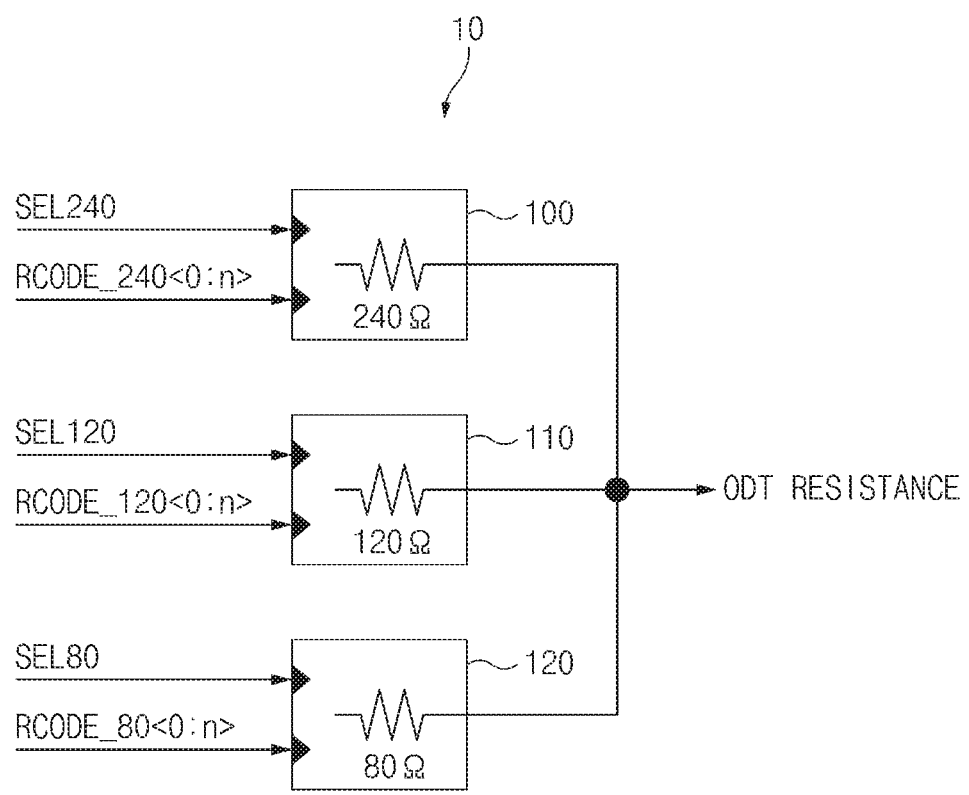
FIG. 1 is a circuit diagram illustrating a resistance generation circuit according to an embodiment of the present disclosure.

Referring to FIG. 1, is a circuit diagram illustrating a resistance generation circuit 10 according to an embodiment of the present disclosure is illustrated.

In FIG. 1, the resistance generation circuit 10 according to an embodiment may include a plurality of On Die Termination (ODT) circuits (100~120). The ODT circuits (100~120) may change a termination value to reduce the number of reflective waves caused by a signal transmission (Tx) path in the system structure.

In this case, the first ODT circuit 100 may be selected by a selection signal SEL240. A reference resistance value of the first ODT circuit 100 is tuned by a first code signal RCODE_240<0:n>, such that a resistance value of 240Ω is output as the ODT resistance. In this case, the first code signal RCODE_240<0:n> may be generated by ZQ calibration.

Recently, with the increasing development of higher-speed electronic systems, a data transfer rate between semiconductor devices configured to construct such systems is of importance. As the number of higher-speed electronic systems rapidly increases, reflection of many more signals occurs in an interface region between an output circuit and a transmission (TX) channel of semiconductor devices, such that a data waveform is distorted during data transmission and it becomes difficult to transmit high-speed data.

To address the above-mentioned issues, impedance of the transmission (Tx) channel and impedance of the output circuit are matched to the interface region. For this purpose, a ZQ calibration circuit is generally used. The ZQ calibration may indicate that the code signal (RCODE) changing with the PVT condition is generated and impedance matching is performed using the resultant code signal (RCODE).

In accordance with an embodiment, a reference resistance of the ODT circuit 100 may be set to 240Ω for convenience of description and better understanding of the present disclosure. However, the scope or spirit of the present disclosure is not limited thereto, and the reference resistance value may be changeable as necessary.

The second ODT circuit 110 may be selected by a selection signal SEL120. A reference resistance value of the second ODT circuit 110 is tuned by a second code signal RCODE_120<0:n>, such that the second ODT circuit 110 may output the ODT resistance of 120Ω corresponding to a half of 240Ω. In this case, the second code signal RCODE_120<0:n> may be generated by ZQ calibration.

The third ODT circuit 120 may be selected by a selection signal SEL80. A reference resistance value of the third ODT circuit 120 is tuned by a third code signal RCODE_80<0:n>, such that the third ODT circuit 120 may output the ODT resistance of 80Ω corresponding to ⅓ of 240Ω. In this instance, the third code signal RCODE_80<0:n> may be generated by ZQ calibration.

As described above, the resistance generation circuit according to an embodiment may output various ODT resistances according to selection signals (SEL240, SEL120, SEL80). In accordance with an embodiment, the individual ODT circuits (100~120) may output different ODT resistance values, such that parasitic capacitance caused by the change of output resistance is not increased. Any one of the selections signals SEL240 and SEL120, for example, may be activated.

Figure 2:
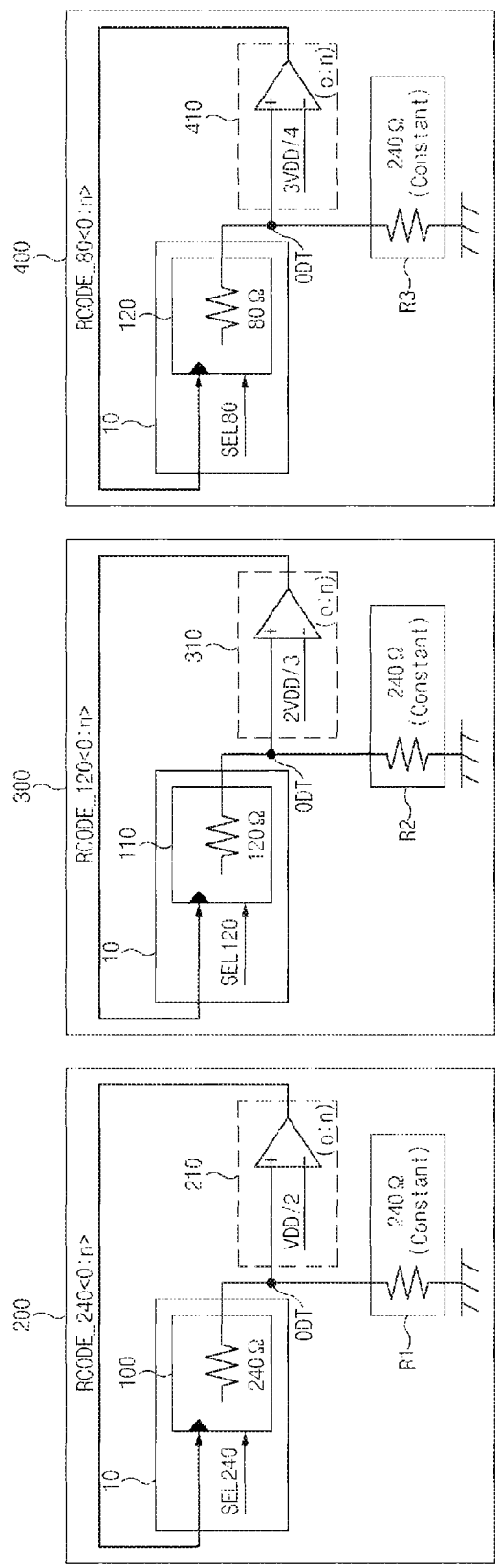
FIG. 2 is a circuit diagram illustrating an impedance calibration (ZQ calibration) circuit including the resistance generation circuit shown in FIG. 1.

Referring to FIG. 2, a circuit diagram illustrating an impedance calibration (ZQ calibration) circuit including the resistance generation circuit 10 shown in FIG. 1 is illustrated.

In FIG. 2, the impedance calibration circuit having the resistance generation circuit 10 may include a plurality of code generation circuits (200~400).

The code generation circuit 200 may include an On Die Termination (ODT) circuit 100, a comparator 210, and a fixed resistor R1.

The ODT circuit 100 may be selected by a selection signal SEL240. A reference resistance value of the ODT circuit 100 is tuned by a first code signal RCODE_240<0:n>, such that the ODT circuit 100 may output the resistance value of 240Ω to the output terminal ODT. In addition, the fixed resistor R1 may have a fixed resistance value of 240Ω.

Accordingly, the final resistance value of the output terminal ODT may be obtained by division of the output resistance of the ODT circuit 100 and the resistance value of the fixed resistor R1. That is, since the output terminal of the ODT circuit 100 is electrically coupled in parallel to the output terminal of the fixed resistor R1, the resistance value of the output terminal ODT may be 120Ω corresponding to a half of 240Ω.

The comparator 210 may compare a voltage value of the output terminal ODT with a reference value (VDD/2), and may thus generate a first code signal RCODE_240<0:n>. In this case, the voltage value of the output terminal ODT may be generated by the ratio of the output resistance of the ODT circuit 100 to the resistance value of the fixed resistor R1. The reference value may have a half of a power-supply voltage VDD.

The code generation circuit 300 may include an ODT circuit 110, a comparator 310, and a fixed resistor R2.

The ODT circuit 110 may be selected by a selection signal SEL120. A reference resistance value of the ODT circuit 110 is tuned by a second code signal RCODE_120<0:n>, such that the ODT circuit 110 may output a resistance value of 120Ω to the output terminal ODT. In addition, the fixed resistor R2 may have a fixed resistance value of 240Ω.

Accordingly, the final resistance value of the output terminal ODT may be obtained by division of the output resistance of the ODT circuit 110 and the resistance value of the fixed resistor R2. Since the output terminal of the ODT circuit 110 is electrically coupled in parallel to the output terminal of the fixed resistor R2, the resistance value of the output terminal ODT may be 80Ω corresponding to ⅓ of 240Ω.

The comparator 310 may compare the voltage value of the output terminal ODT with a reference value (2VDD/3), and may thus generate a second code signal RCODE_120<0:n>. In this instance, the voltage value of the output terminal ODT may be generated by the ratio of the output resistance of the ODT circuit 110 to the resistance value of the fixed resistor R2. The reference value may have a value of ⅔ of a power-supply voltage VDD.

The code generation circuit 400 may include an ODT circuit 120, a comparator 410, and a fixed resistor R3.

The ODT circuit 120 may be selected by a selection signal SEL80. A reference resistance value of the ODT circuit 120 is tuned by a third code signal RCODE_80<0:n> such that the ODT circuit 120 may output a resistance value of 80Ω to the output terminal ODT. In addition, the fixed resistor R3 may have a fixed resistance value of 240Ω.

Accordingly, the final resistance value of the output terminal ODT may be obtained by division of the output resistance of the ODT circuit 120 and the resistance value of the fixed resistor R3. Since the output terminal of the ODT circuit 120 is electrically coupled in parallel to the output terminal of the fixed resistor R3, the resistance value of the output terminal ODT may be 60Ω corresponding to ¼ of 240Ω.

The comparator 410 may compare the voltage value of the output terminal ODT with a reference value (3VDD/4), and may thus generate a third code signal RCODE_80<0:n>. In this case, the voltage value of the output terminal ODT may be generated by the ratio of the output resistance of the ODT circuit 120 to the resistance value of the fixed resistor R3. The reference value may have a value of ¾ of a power-supply voltage VDD.

The comparators (210, 310, 410) may have different reference values so as to tune different code signals (RCODE_240<0:n>, RCODE_120<0:n>, RCODE_80<0:n>), resulting in increased accuracy of pad resistance.

In this instance, the code generation circuit 200 may output a resistance value of 120Ω to the output terminal ODT; the code generation circuit 300 may output a resistance value of 80Ω to the output terminal ODT; and the code generation circuit 400 may output a resistance value of 60Ω to the output terminal ODT.

It is necessary for ODT used by a DRAM device to guarantee the accuracy of pad resistance so as to improve signal quality. The embodiment may optimize each pad resistor structure using the ZQ calibration circuit. As described above, the embodiment minimizes the number of pad connection circuits, and reduces the overlap parasitic capacitance in each pad, such that signal integrity (SI) of the output signal can be improved.

Figure 3:
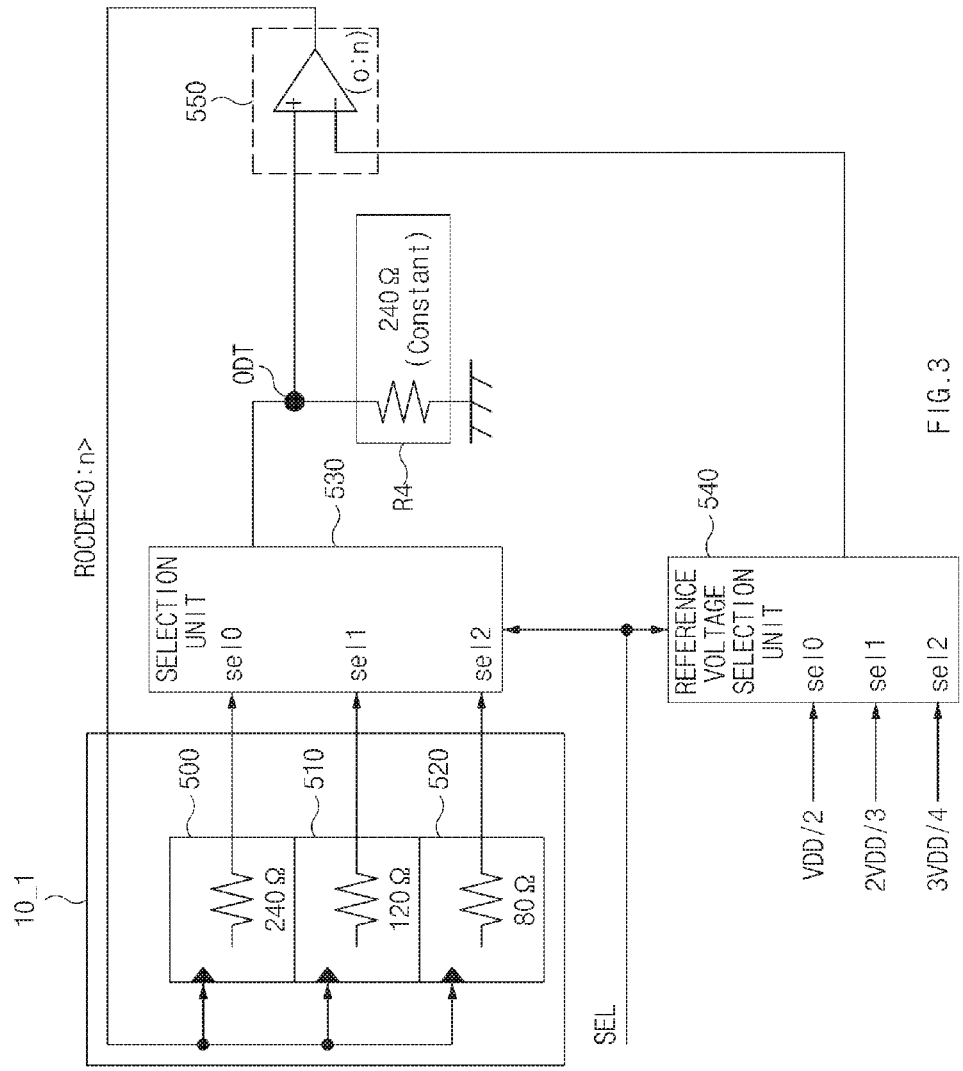
FIG. 3 is a circuit diagram illustrating an impedance calibration (ZQ calibration) circuit according to an embodiment of the present disclosure.

Referring to FIG. 3, is a circuit diagram illustrating an impedance calibration (ZQ calibration) circuit according to an embodiment of the present disclosure is illustrated.

In FIG. 3, the impedance calibration circuit includes a resistance generation circuit (10_1) having a plurality of ODT circuits (500~520), a selection unit 530, a reference voltage selection unit 540, a comparator 550, and a fixed resistor R4.

In this instance, the first ODT circuit 500 may tune a reference resistance value using the code signal RCODE<0:n>, and output a resistance value of 240Ω. The second ODT circuit 510 may tune a reference resistance value using the code signal RCODE<0:n>, and thus output a resistance value of 120Ω. In addition, the third ODT circuit 520 may tune a reference resistance value using the code signal RCODE<0:n>, and output a resistance value of 80Ω.

The selection unit 530 may select any one of plural ODT circuits (500~520) in response to the selection signal SEL, and output the selected ODT circuit to the output terminal ODT.

If the signal (sel0) is selected by the selection signal SEL, the selection unit 530 may output the output resistance of the first ODT circuit 500 to the output terminal ODT. If the signal (sel1) is selected by the selection signal SEL, the selection unit 530 may output the output resistance of the second ODT circuit 510 to the output terminal ODT. In addition, if the signal (sel2) is selected by the selection signal SEL, the selection unit 530 may output the output resistance of the third ODT circuit 520 to the output terminal ODT.

The reference voltage selection unit 540 may select any one of several reference voltages (VDD/2, 2VDD/3, 3VDD/4) in response to the selection signal SEL, and output the selected reference voltage to the comparator 550. The impedance calibration circuit shown in FIG. 3 may convert a comparison voltage without addition of the ZQ calibration circuit, and generate a code signal using the conversion result.

If the signal (sel0) is selected by the selection signal SEL, the reference voltage selection unit 540 may select the first reference voltage (VDD/2), and output the selected first reference voltage (VDD/2) to the comparator 550. If the signal (sel1) is selected by the selection signal SEL, the reference voltage selection unit 540 may select the second reference voltage (2VDD/3), and output the selected second reference voltage (2VDD/3) to the comparator 550. In addition, if the signal (sel2) is selected by the selection signal SEL, the reference voltage selection unit 540 may select the third reference voltage (3VDD/4), and output the selected third reference voltage (3VDD/4) to the comparator 550.

For example, if the selection unit 530 selects a first ODT circuit 500, the first reference voltage (VDD/2) may be selected as a reference voltage. If the selection unit 530 selects the second ODT circuit 510, the second reference voltage (2VDD/3) may be selected as a reference voltage. In addition, if the selection unit 530 selects the third ODT circuit 520, the third reference voltage (3VDD/4) may be selected as a reference voltage.

The fixed resistor R2 may always output a constant resistance value to the output terminal ODT.

If the selection unit 530 selects the first ODT circuit 500, the resistance value of 240Ω is output to the output terminal ODT. In addition, the fixed resistor R2 may have a fixed resistance value of 240Ω. Therefore, the final resistance value of the output terminal ODT may be obtained by division of the output resistance of the ODT circuit 110 and the resistance value of the fixed resistor R4. Since, the output terminal of the selection unit 530 is electrically coupled in parallel to the output terminal of the fixed resistor R4, the resistance value of the output terminal ODT may be 120Ω corresponding to a half of 240Ω.

If the selection unit 530 selects the second ODT circuit 510, the resistance value of 120Ω is output to the output terminal ODT. In addition, the fixed resistor R2 may have a fixed resistance value of 240Ω. Therefore, the final resistance value of the output terminal ODT may be obtained by division of the output resistance of the ODT circuit 110 and the resistance value of the fixed resistor R4. Since the output terminal of the selection unit 530 is electrically coupled in parallel to the output terminal of the fixed resistor R4, the resistance value of the output terminal ODT may be 80Ω corresponding to ⅓ of 240Ω.

If the selection unit 530 selects the third ODT circuit 520, the resistance value of 80Ω is output to the output terminal ODT. In addition, the fixed resistor R2 may have a fixed resistance value of 240Ω. Therefore, the final resistance value of the output terminal ODT may be obtained by division of the output resistance of the ODT circuit 110 and the resistance value of the fixed resistor R4. That is, since the output terminal of the selection unit 530 is electrically coupled in parallel to the output terminal of the fixed resistor R4, the resistance value of the output terminal ODT may be 60Ω corresponding to ¼ of 240Ω.

The comparator 550 may compare a voltage value of the output terminal ODT with the output voltage of the reference voltage selection unit 540, and generate a code signal RCODE<0:n>. In this case, the voltage value of the output terminal ODT may be generated by the ratio of the output resistance of the selection unit 530 to the resistance value of the fixed resistor R4.

For example, if the resistance value of the output terminal is 120Ω, the voltage value of the output terminal ODT is compared with the reference voltage (VDD/2). If the resistance value of the output terminal is 80Ω, the voltage value of the output terminal ODT is compared with the reference voltage (2VDD/3). In addition, if the resistance value of the output terminal is 60Ω, the voltage value of the output terminal ODT is compared with the reference voltage (3VDD/4).

As described above, an embodiment of the present disclosure improves precision of pad resistance, resulting in increased quality of transmission (Tx) signals.

As is apparent from the above description, the impedance calibration circuit according to the embodiments can reduce signal distortion caused by reflective waves generated by impedance mismatch between a transmission (Tx) line and a device output terminal in a module or system structure.

Figure 4:
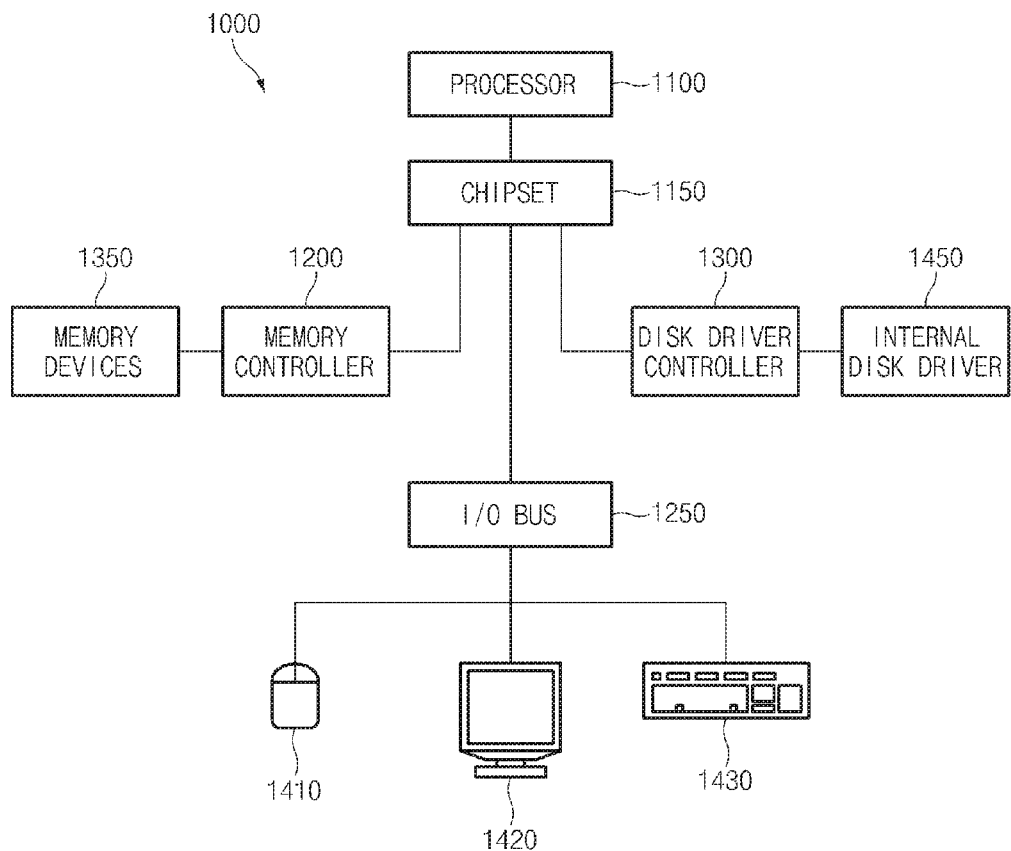
FIG. 4 illustrates a system including the impedance calibration (ZQ calibration) circuit according to an embodiment of the present disclosure.

Referring to FIG. 4, a system 1000 may include one or more processors (i.e. Processor), or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

The memory controller 1200 may be operably coupled to the chipset 1150. The memory controller 1200 can receive a request provided from the processor (i.e., CPU) 1100 through the chipset 1150. The memory controller 1200 may be operably coupled to one or more memory devices 1350. In an embodiment, The memory devices 1350 may include the impedance calibration (ZQ calibration) circuit discussed above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include, for example, but are not limited to, a mouse 1410, a video display 1420, or a keyboard 1430. The I/O bus 1250 may employ any one of a number of communications protocols to communicate with the I/O devices 1410, 1420 and 1430.

The disk driver controller 1300 may be operably coupled to the chipset 1150. The disk driver controller 1300 may serve as the communication pathway between the chipset 1140 and one internal disk driver 1450 or more than one internal disk driver 1450. The disk driver controller 1300 and the internal disk driver 1450 may communicate with each other or with the chipset 1150 using virtually any type of communication protocol.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the present disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the present disclosure or included as a new claim by a subsequent amendment after the application is filed.

Although a number of illustrative embodiments consistent with the present disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the figures and the accompanying claims. In addition to variations and modifications in the component parts and/or arrangements, alternative uses will also be apparent to those skilled in the art.

What is claimed is:

1. An impedance calibration circuit comprising:
   a plurality of On Die Termination (ODT) circuits tuned by a code signal, configured to output a plurality of fixed resistance values to an output terminal;
   a selection unit configured to select any one of the plurality of fixed resistance values using a selection signal;
   a reference voltage selection unit configured to select any one of a plurality of reference voltages using the selection signal;
   a fixed resistor having a fixed resistance value; and
   a comparator configured to compare a voltage generated by a ratio of the fixed resistance value of the fixed resistor to a resistance value of the output terminal with an output voltage of the reference voltage selection unit, and output the code signal according to a result of the comparison, wherein the plurality of fixed resistance values each have different values.

2. The impedance calibration circuit according to claim 1, wherein the plurality of reference voltages are composed of three reference voltages VDD/2, 2VDD/3, and 3VDD/4, wherein VDD is a power-supply voltage.

3. The impedance calibration circuit according to claim 1, wherein the comparator is configured to compare a voltage value of the output terminal with the output voltage of the reference voltage selection unit to generate the code signal.

4. The impedance calibration circuit according to claim 3, wherein the voltage value of the output terminal is generated by a ratio of an output resistance of the selection unit to the fixed resistance value.

5. The impedance calibration circuit according to claim 1, wherein the selection unit is configured to output the one of the plurality of resistance values of a first, second or third ODT circuit to the output terminal.

6. The impedance calibration circuit according to claim 1, wherein the reference voltage selection unit is configured to output a first reference voltage, a second reference voltage, or a third reference voltage to the comparator.

7. The impedance calibration circuit according to claim 6, wherein the reference voltage selection unit outputs the first reference voltage, the second reference voltage, or the third reference voltage to the comparator based on a signal selected by a selection signal.

* * * * *